United States Patent
Wakrat et al.

(10) Patent No.: US 9,069,660 B2
(45) Date of Patent: Jun. 30, 2015

(54) SYSTEMS AND METHODS FOR WRITING TO HIGH-CAPACITY MEMORY

(71) Applicant: Apple Inc., Cupertino, CA (US)

(72) Inventors: Nir Jacob Wakrat, Los Altos, CA (US); Matthew J. Byom, San Jose, CA (US)

(73) Assignee: APPLE INC., Cupertino, CA (US)

(*) Notice: Subject to any disclaimer, the term of this patent is extended or adjusted under 35 U.S.C. 154(b) by 288 days.

(21) Appl. No.: 13/840,008

(22) Filed: Mar. 15, 2013

(65) Prior Publication Data
US 2014/0281136 A1 Sep. 18, 2014

(51) Int. Cl.
*G06F 12/02* (2006.01)
*G11C 16/10* (2006.01)
*G11C 16/00* (2006.01)

(52) U.S. Cl.
CPC .......... *G06F 12/0246* (2013.01); *G11C 16/00* (2013.01)

(58) Field of Classification Search
None
See application file for complete search history.

(56) References Cited

U.S. PATENT DOCUMENTS

| | | | | |
|---|---|---|---|---|
| 5,418,940 | A | * | 5/1995 | Mohan .................. 714/5.11 |
| 5,426,749 | A | * | 6/1995 | Morioka ..................... 711/3 |
| 2003/0016559 | A1 | * | 1/2003 | Kawai et al. ........... 365/185.12 |
| 2004/0090827 | A1 | * | 5/2004 | Dahlen et al. ............. 365/200 |
| 2005/0162930 | A1 | * | 7/2005 | Mukaida ............... 365/185.33 |
| 2006/0123035 | A1 | * | 6/2006 | Ivie ........................ 707/101 |
| 2008/0046639 | A1 | * | 2/2008 | Tsuji ....................... 711/103 |
| 2008/0250195 | A1 | * | 10/2008 | Chow et al. ................ 711/103 |
| 2008/0301256 | A1 | * | 12/2008 | McWilliams et al. ........ 714/758 |
| 2009/0196103 | A1 | * | 8/2009 | Kim ..................... 365/185.12 |
| 2009/0259805 | A1 | * | 10/2009 | Kilzer et al. ............... 711/103 |
| 2010/0042773 | A1 | * | 2/2010 | Yeh ........................ 711/103 |
| 2011/0078529 | A1 | * | 3/2011 | Wu et al. .................. 714/748 |
| 2011/0289263 | A1 | * | 11/2011 | McWilliams et al. ........ 711/103 |
| 2013/0103889 | A1 | * | 4/2013 | Jeong ...................... 711/103 |
| 2013/0117606 | A1 | * | 5/2013 | Anholt et al. ............... 714/15 |
| 2014/0133233 | A1 | * | 5/2014 | Li et al. ................. 365/185.11 |

* cited by examiner

*Primary Examiner* — Daniel Bernard
(74) *Attorney, Agent, or Firm* — Van Court & Aldridge LLP

(57) ABSTRACT

Systems and methods for writing to high-capacity memory are disclosed. In high-capacity memory systems in which the capacity of the characteristic portion of the memory (e.g., a page of NAND flash memory) exceeds the capacity of a buffer used to write to the memory, underutilization issues are prevalent. Data organized in the buffer can be combined with additional data to improve utilization of the characteristic portion. According to various embodiments, the additional data can include duplicate copies of the data, whitened data, or any other suitable type of data.

21 Claims, 6 Drawing Sheets

SYSTEMS AND METHODS FOR WRITING TO HIGH-CAPACITY MEMORY

BACKGROUND

Various types of nonvolatile memory ("NVM"), such as flash memory (e.g., NAND flash memory and NOR flash memory), can be used for mass storage. For example, consumer electronics (e.g., portable media players) use flash memory to store data, including music, videos, images, and other media or types of information.

A host device can initiate a write request to store data in an NVM. The data can be buffered at the host and sent to the NVM in packets of a predetermined size. In order to optimize usage of the NVM, the predetermined size can match a characteristic capacity associated with the NVM. For example, the data can be sent to the NVM in packets that match the page capacity of the NVM.

SUMMARY

Systems and methods for writing to high-capacity memory are provided. Such a system can include a host controller of a host device, a memory controller of an NVM package, and one or more NVM dies. The host device can also include a buffer for organizing data associated with write requests into packets of a predetermined size in order to maximize utilization and reliability of the NVM. The predetermined size may be chosen to match the capacity of a characteristic portion of the NVM (e.g., the capacity of a page). However, in the event that the capacity of the buffer is both inflexible and less than the capacity of the characteristic portion of the NVM, serious underutilization and reliability issues may result. Accordingly, additional data can be programmed to the characteristic portion to avoid such issues.

A method for writing data to an NVM can begin with the host initiating a request to write the data to the NVM. If the capacity of the host buffer is smaller than the capacity of a characteristic portion of the NVM, the data can be written from the host to the NVM followed by the programming of additional data to the characteristic portion. In some embodiments, the data can be written from the host to the NVM multiple times (e.g., two times). In other embodiments, a memory controller in the package that contains the NVM can receive the data from the host and program it multiple times to the NVM. In still other embodiments, the unused capacity of the characteristic portion may be programmed with whitened data, metadata, or any other suitable data.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION

A host buffer can be incorporated within an NVM system for improving utilization of NVM that the host device can use for data storage. During a write operation in which the host transfers data to the NVM, the host buffer can packetize the data into chunks that correspond to the capacity of a characteristic portion of the NVM. For example, in the case of NAND flash memory, the characteristic portion may be a page of flash memory. As used herein, the term "characteristic portion" can refer to the smallest portion of the NVM that can be programmed. For example, a characteristic portion of NAND flash memory may be a page. With the data pre-buffered at the host, the utilization (e.g., the fraction of the capacity programmed with data) of characteristic portion can be maximized. Optimizing utilization may be important for a number of reasons, including maximizing the overall memory usage and limiting reliability concerns due to uneven charging in the memory array.

In some NVM systems, the size of the host buffer may be fixed, regardless of the capacity of the characteristic portion of the NVM used by the host for storage. For example, the capacity of the host buffer may be dictated by hardware limitations such as, for example, the amount of physical memory available for dedicated host-buffer use. The capacity of the host buffer may also be dictated by software or firmware that may be difficult or impracticable to change.

If the size of the host buffer is inflexible, it may be difficult to maximize utilization for the characteristic portion of the NVM included in the system. For example, an NVM with a characteristic portion capacity that does not match the size of the host buffer may be chosen for reasons related to cost and/or availability. For instance, "high-capacity" NAND, which can refer to NAND flash memory with a page capacity larger than the size of the host buffer, may be used for host storage if, for example, legacy low-capacity NAND is unavailable or more expensive. Typically, in such cases the data would be written to the NVM, leaving some fraction of the characteristic portion unprogrammed, which both wastes storage capacity and leads to reliability concerns.

Accordingly, the NVM system can program additional data to the characteristic portion in order to alleviate these issues. In some embodiments, the data programmed to the characteristic portion can be duplicated to improve utilization. Duplicating the data can improve data integrity throughout the system while solving the utilization issues resulting from a mismatch between the host buffer size and the capacity of the characteristic portion of the NVM. In other embodiments, different data may be programmed to the characteristic portion to fill the capacity not utilized by the data received from the host. The different data may be of any type such as, for example, whitened data, metadata, or any other suitable data.

Figure 1:
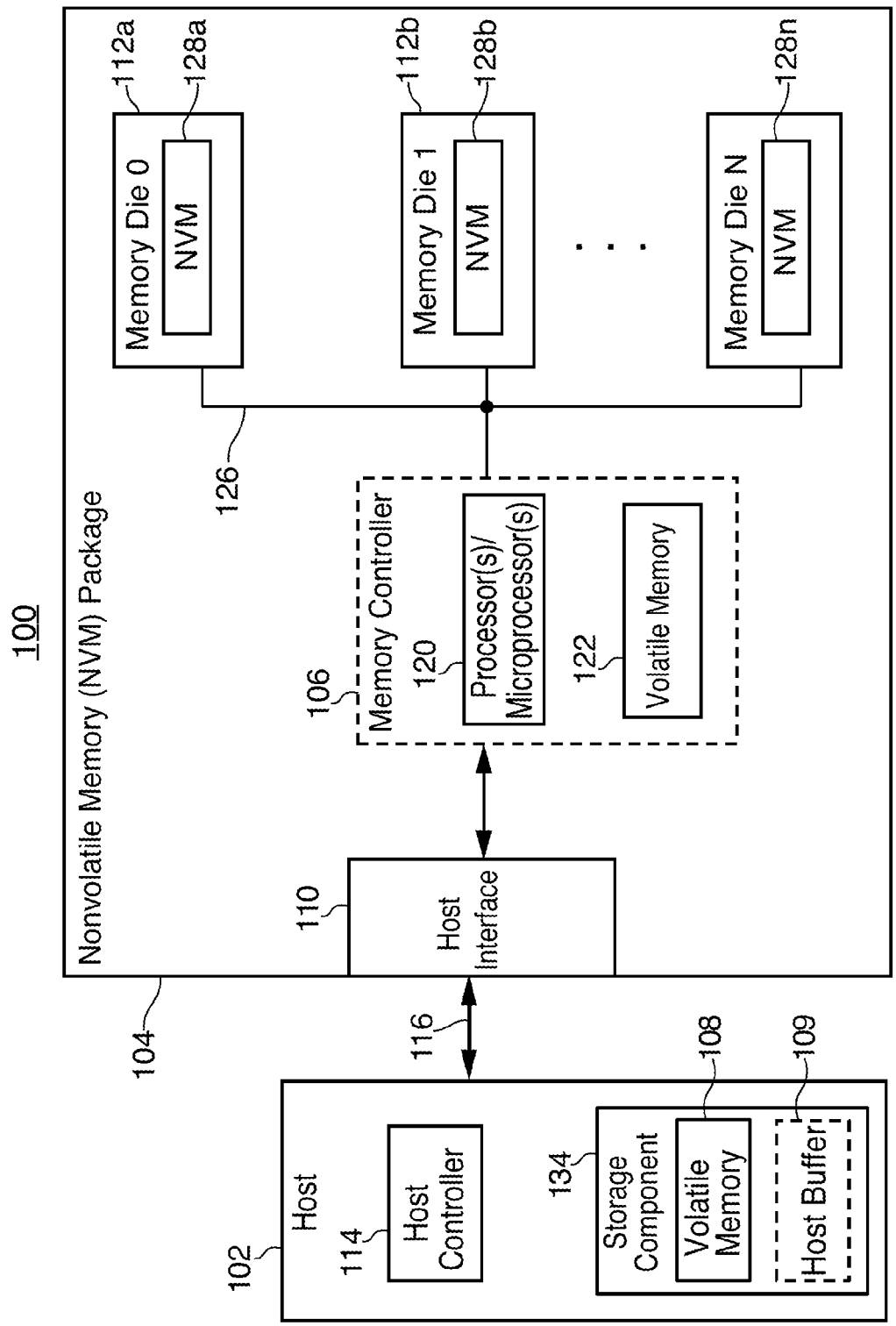
FIG. 1 is a diagram depicting an illustrative system that includes a host and an NVM package with a memory controller in accordance with various embodiments.

FIG. 1 is a diagram depicting system 100, including NVM package 104 and host 102. Host 102 may be configured to provide memory access requests (e.g., read, program, and erase commands) to NVM package 104, which can include memory controller 106, host interface 110, and NVM dies 112*a-n* with corresponding NVMs 128*a-n*.

Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128*a-n* (e.g., in NVM dies 112*a-n*) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, program, and erase operations, to NVM package 104. Host controller 114 can include one or more processors and/or microprocessors that are configured to perform operations based on the execution of software and/or firmware instructions. Additionally or alternatively, host controller 114 can include hardware-based components, such as application-specific integrated circuits ("ASICs"), that are configured to perform various operations. Host controller 114 can format information (e.g., commands and/or data) transmitted to NVM package 104 according to a communications protocol shared between host 102 and NVM package 104.

Host 102 can include a storage component 134 including volatile memory 108 and a host buffer 109. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a set of access requests to be sent to, or to store data received from, NVM package 104.

Like volatile memory 108, host buffer 109 may be any of a variety of volatile memory types. Host buffer 109 is drawn in dashed lines to indicate that in various embodiments, one or more host buffers may reside in both, either, or neither of host 102 and NVM package 104. For example, host buffer 109 can be physically part of volatile memory 108 (e.g., part of the same physical memory array) or host buffer 109 can be physically separate from volatile memory 108 (e.g., host buffer 109 can be a separate module in host 102, NVM package 104, or otherwise communicatively coupled to various components of system 100). Host controller 114 can use host buffer 109 to buffer, or temporarily store, data before transferring it to NVM package 104.

In some embodiments, host controller 114 may be configured to store a fixed, predetermined amount of data in host buffer 109 before transferring that data to NVM package 104. For example, as part of a write request, host controller 114 may be configured to store 8K of data in host buffer 109 and then send that 8K of data to NVM package 104. The fixed amount of data temporarily stored in host buffer 109 may be determined based upon the capacity of host buffer 109, software instructions, and/or firmware instructions. The fixed amount of data may be the same as or different from the capacity of a characteristic portion of NVMs 128*a-n* of NVM dies 112*a-n*. For example, the characteristic portion of NVMs 128*a-n* may be a page of NAND flash memory with any suitable capacity (e.g., 8K, 16K, or 32K).

Host 102 can communicate with NVM package 104 over communications channel 116 using host interface 110 and memory controller 106. Communications channel 116 can be any bus suitable for bidirectional communications. Communications channel 116 can be fixed, detachable, or wireless. Communications channel 116 can be, for example, a universal serial bus (USB), serial advanced technology (SATA) bus, or any other suitable bus.

Memory controller 106 can include one or more processors and/or microprocessors 120 that are configured to perform operations based on the execution of software and/or firmware instructions. Additionally or alternatively, memory controller 106 can include hardware-based components, such as ASICs, that are configured to perform various operations. Memory controller 106 can perform a variety of operations, such as dispatching commands issued by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

As depicted in FIG. 1, memory controller 106 can be incorporated into the same package as NVM dies 112*a-n*. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114). In still further embodiments, each NVM die 112*a-n* can include its own dedicated memory controller.

Memory controller 106 may include volatile memory 122. Volatile memory 122 can be any of a variety of volatile memory types, such as cache memory or RAM. Memory controller 106 can use volatile memory 122 to perform access requests and/or to temporarily store data that is being read from and/or written to NVMs 128*a-n* in NVM dies 112*a-n*. For example, volatile memory 122 can store firmware and memory controller 106 can use the firmware to perform operations on NVM package 104 (e.g., read/program operations). Memory controller 106 can use NVMs 128*a-n* to persistently store a variety of information, such as debug logs, instructions, and firmware that NVM package 104 uses to operate.

Memory controller 106 can use shared internal bus 126 to access NVMs 128*a-n*. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to NVM dies 112*a-n*. NVM dies 112*a-n* can be physically arranged in a variety of configurations, including a stacked configuration, and may be, according to some embodiments, integrated circuit ("IC") dies.

NVMs 128*a-n* can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof.

NVMs 128*a-n* can be organized into "blocks", which can the smallest erasable unit, and further organized into "pages", which can be the smallest unit that can be programmed or read. In some embodiments, NVMs 128*a-n* can include multiple integrated circuits, where each integrated circuit may have multiple blocks. Memory locations (e.g., blocks or pages of blocks) from corresponding integrated circuits may form "super blocks". Each memory location (e.g., page or block) of NVMs 128*a-n* can be referenced using a physical address (e.g., a physical page address or physical block address).

Figure 2:
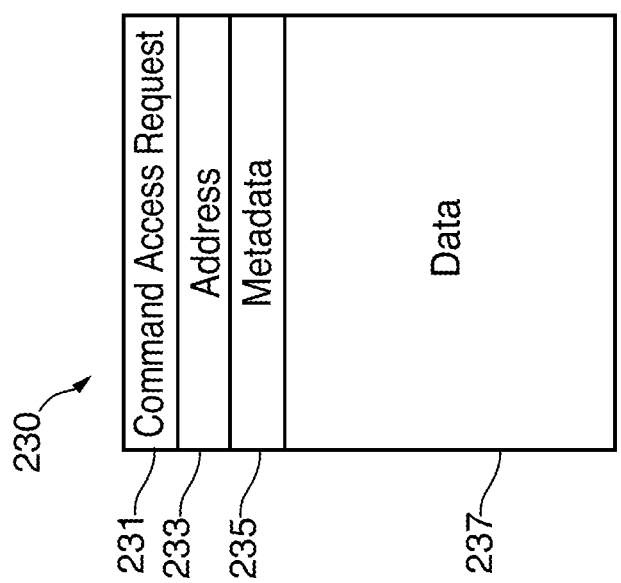
FIG. 2 is an illustrative diagram of a command packet in accordance with various embodiments.

FIG. 2 is an illustrative diagram of command packet 230, which may be transferred between a host (e.g., host 102 of FIG. 1) device and a memory controller (e.g., memory controller 106 of FIG. 1). Command packet 230 can include command access request 231, address 233, data 237, and metadata 239. Command access request 231 can be any suitable instruction provided by the host device to the memory controller such as, for example, a read, program, or erase request. Address 233 can be the physical address(es) within the NVM to be accessed.

Command packet 230 can also include data 237 and metadata 239. For example, when access request is a program request, data 237 can be the data being programmed to the NVM. Data 237 can be any suitable type of data. In embodiments in which the host device is a media player, data 237 can represent one or more media files (e.g., songs, videos, images, eBooks, etc.). Metadata 239 can include any information used for managing the mapping between logical and physical addresses, bad block management, wear leveling, error-correcting code ("ECC") data used for detecting or correcting data errors, or any combination thereof.

In an exemplary command program request, the memory controller can receive a program command packet from the host device over a communications channel (e.g., communications channel 116 of FIG. 1) in a first bus cycle and store it in a command register (e.g., in volatile memory 122). One or more bus cycles can then be used to input the address 233 into an address register in the volatile memory. Next, data 237 and metadata 239 can be loaded into a page buffer and then programmed into NVM at the address stored in the address register.

According to some embodiments, command packet 230 may be organized within a host buffer (e.g., host buffer 109 of FIG. 1). The host buffer may have a fixed, predetermined capacity and, therefore, any command packet organized within the host buffer may have a fixed size. Dedicated capacity in may be designated for each of command access request 231, address 233, and metadata 239, as each of these segments are likely to require an identical amount of memory for any given command packet. Such dedication of capacity is not necessary, however, and the capacity available for data 237 may be allowed to vary depending on the capacity necessary to store command access request 231, address 233, and metadata 239.

The balance of the capacity of the host buffer may be consumed by data associated with the command program request. For example, the host may initiate a request to write a large amount of data to an NVM (e.g., NVMs 128*a-n* of FIG. 1). If the amount of data to be written exceeds the size of the host buffer, the data can be packetized into individual command packets 230, where command packet 230 includes a segment of data 237 occupying the capacity of the host buffer not used by command access request 231, address 233, and metadata 239. The individual command packets 230 can be created and transferred to the memory controller for programming to the NVM until all of the data associated with the command access request is transferred.

In an exemplary command read request, the memory controller can receive a command read packet from the host device over the communications channel in a first bus cycle and store it in the command register. One or more bus cycles can be used to input address 233 into an address register. Next, data stored in NVM at address 233 can be transferred to a page buffer and transferred to the host when the bus is ready.

Figure 3:
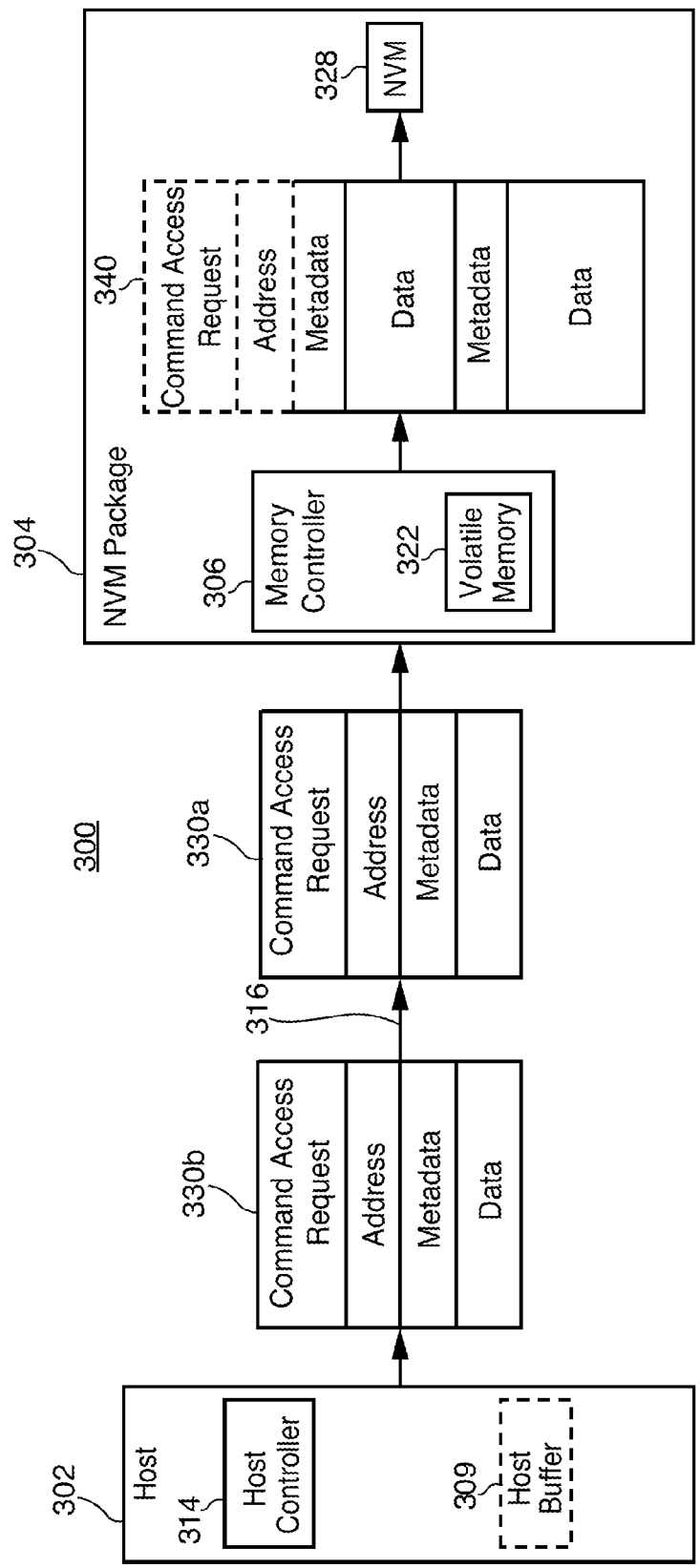
FIG. 3 is an illustrative diagram of a system with command packets being transferred from a host to an NVM package in accordance with various embodiments.

FIG. 3 is an illustrative diagram of a system 300 with command packets 330*a* and 330*b* being transferred from a host 302 to an NVM package 304, in accordance with some embodiments. Host 302 can be any of a variety of host devices and/or systems and may correspond to host 102 of FIG. 1, for example. Further, host 302 can include host controller 314 and host buffer 309, which may correspond to host controller 114 and host buffer 109 of FIG. 1.

Host 302 can provide access requests (e.g., read, write, or erase requests) to NVM package 304. In the case of write requests, host 302 may write data to NVM package 304 using host controller 314 and host buffer 309.

For example, host controller 314 can issue a request for data to be written to NVM 328 in NVM package 304. The data to be written may be buffered and segmented into command packets (e.g., command packets 330*a* and 330*b*) for transfer to NVM package 304. As shown, command packet 330*a* and command packet 330*b* each include a command access request, an address, metadata, and data. Command packets 330*a* and 330*b* may each correspond to command packet 230, described above with respect to FIG. 2.

If the capacity of host buffer 309 is less than a characteristic capacity of the NVM in NVM package 304, the command packets organized by host buffer 309 may be too small to fully utilize the characteristic portions of the NVM. For example, if each command packet generated by host buffer 309 includes 8K of data and metadata and the capacity of the characteristic portion of the NVM is 16K, half of the capacity of the characteristic portion will be unutilized when the data and metadata are programmed to the NVM. Because the characteristic portion is the smallest portion of the NVM that may be programmed, the unprogrammed space would be left blank. Blank, unprogrammed capacity within a page can result in large voltage gradients within the page and between neighboring pages, which can lead to leakage, errors, and shortened lifetime for the NVM. Furthermore, the unprogrammed capacity within a characteristic portion represents wasted storage space.

According to some embodiments, host 302 may duplicate a write request, thereby transferring the same command packet to NVM package 304 twice (or any suitable number of times). As shown in FIG. 3, command packet 330*a* can be organized in host buffer 309 and transferred from host 302 to NVM package 304. Command packet 330*a* may be transferred over a communications channel 316, which may correspond to communications channel 116 of FIG. 1. Command packet 330*b*, which may be a duplicate of command packet 330*a*, may then be transferred to NVM package 304 over communications channel 316.

Duplicating the write request may be advantageous in embodiments in which the capacity of host buffer 309 is up to and including half of the capacity of the characteristic portion of NVM 328 of NVM package 304. One skilled in the art will appreciate that any suitable number of duplicates may be generated and transferred from host 302 to NVM package 304 depending on the relative capacities of host buffer 309 and the capacity of the characteristic portions of NVM 328. For clarity, the embodiment depicted in FIG. 3 assumes that the capacity of the characteristic portions of NVM 328 is twice the capacity of host buffer 309.

Duplicating the write request may be undertaken in any suitable manner. As one example, a single command packet 330a may be organized in host buffer 309 and transferred twice. In such embodiments, a copy of command packet 330a may be stored in a memory component of host 302 (e.g., a volatile memory such as volatile memory 108 of FIG. 1). Accordingly, host controller 314 can transfer the original command packet 330a and a copy of the original command packet 330b to NVM package 304. Command packets 330a and 330b may be transferred to NVM package 304 consecutively or non-consecutively.

As another example, host 302 can create two separate command packets 330a and 330b and transfer the command packets to NVM package 304 separately. In these embodiments, host controller 314 can simply repeat each write request twice, with the result being that two identical command packets 330a and 330b are transferred to NVM package 304 consecutively or non-consecutively.

When command packets 330a and 330b are received at NVM package 304, they can be combined into a single command packet for programming to NVM 328 within NVM package 304. In some embodiments, a memory controller within NVM package 304 can receive command packets 330a and 330b and combine them into a single command 340. Because the segments of command packets 330a and 330b are identical and only the data and metadata are actually programmed to NVM 328, command 340 can include one copy of the command access request, one copy of the address. The command access request and address are drawn in dashed lines in FIG. 3 to indicate that those segments of command 340 may not be programmed to NVM 328. To ensure that the characteristic portion associated with the address is well utilized, however, command 340 can further include two copies of the metadata and two copies of the data (e.g., one copy of data and metadata from command packet 330a and one copy of data and metadata from command packet 330b).

The metadata and data in command 340 can be organized and programmed to NVM 328 in any suitable manner. As one example, and as illustrated in FIG. 3, the data and metadata from command packet 330a can be programmed in the first half of a characteristic portion, and the data and metadata from command packet 330b can be programmed in the second half of the characteristic portion. As a further example, one or both copies of the metadata may be programmed into a header of the characteristic portion, and both copies of the data can be programmed into the balance of the characteristic portion.

When reading from characteristic portions of NVM 328 that have been written twice, it may only be necessary to read from the first half of the characteristic portion, eliminating the need to extract the entire characteristic portion from the NVM. Moreover, if an error is detected (e.g., using Error Correction Code, "ECC") in the first half of the characteristic portion, the second half of the characteristic portion may be extracted immediately. Thus, latency may be reduced during a read operation in which an error is detected. The detected error, meanwhile, may be corrected later (e.g., during a downtime when the NVM is not being accessed).

Figure 4:
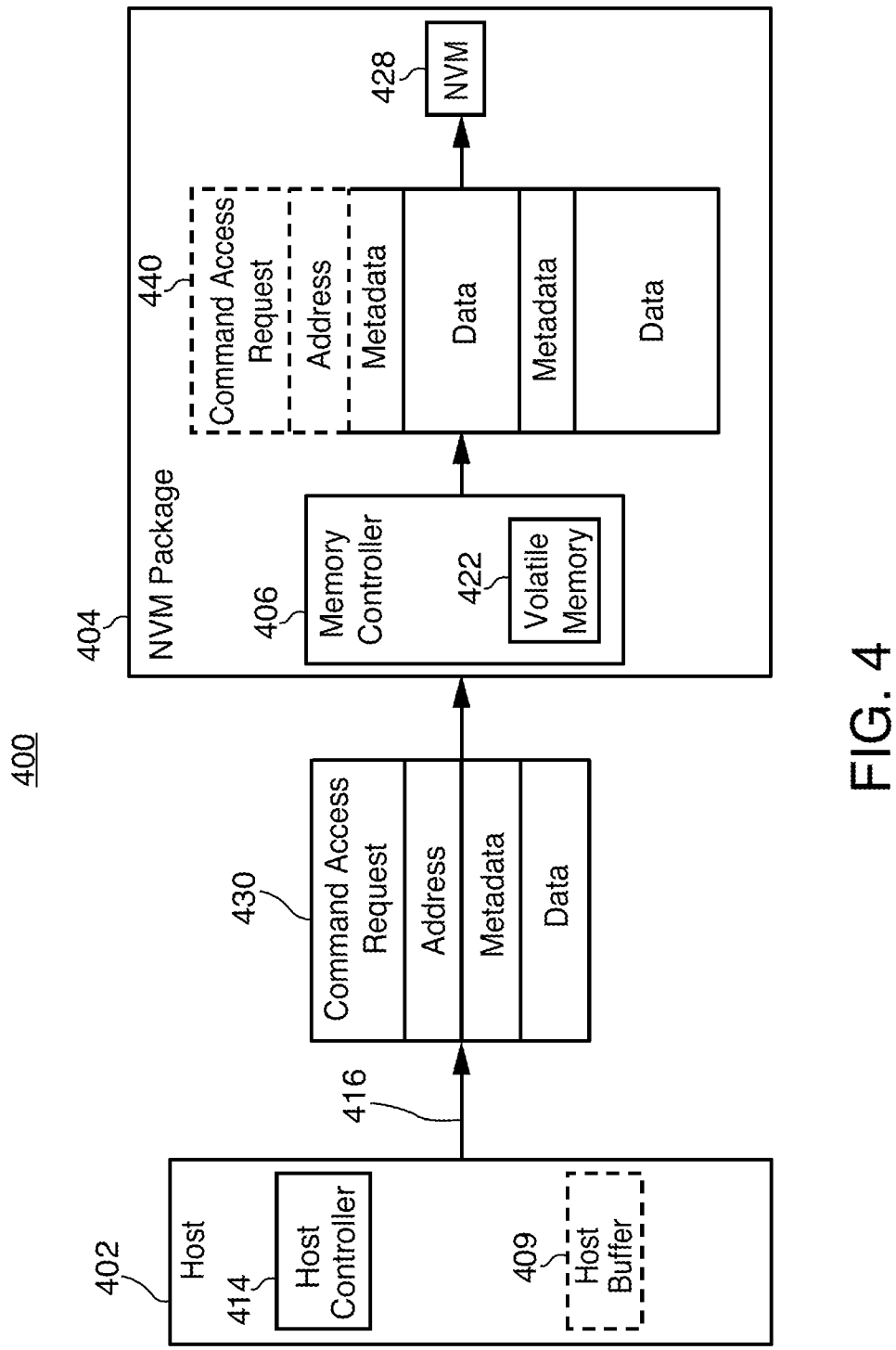
FIG. 4 is another illustrative diagram of a system with a command packet being transferred from a host to an NVM package in accordance with various embodiments.

FIG. 4 is an illustrative diagram of a system 400 including command packet 430 being transferred from a host 402 to an NVM package 404, in accordance with some embodiments. Host 402 can be any of a variety of host devices and/or systems and may correspond to host 102 of FIG. 1, for example. Further, host 402 can include host controller 414 and host buffer 409, which may correspond to host controller 114 and host buffer 109 of FIG. 1.

System 400 may be similar to system 300 except that host 402 only writes data to NVM package 404 once, with any duplication of the data carried out by memory controller 406. In particular, if host buffer 409 has a smaller capacity than the characteristic capacity of NVM 428, memory controller 406 can duplicate data received from host 402 in order to provide the benefits disclosed above (e.g., improving data integrity and reducing reliability issues).

Thus, host 402 can organize data in host buffer 409 to create command packet 430, which can correspond to command packet 230 of FIG. 2, for example. Command packet 430 can then be transferred to NVM package 404 over communications channel 416. In embodiments in which command packet 430 is less than half of the capacity of a characteristic portion of NVM 428, memory controller 406 can receive command packet 430 and create at least one duplicate copy. For example, if command packet 430 is half the size of the capacity of the characteristic portion of NVM 428, memory controller 406 can create one duplicate copy. If command packet 430 is one-third the size of the capacity of the characteristic portion of NVM 428, memory controller 406 can create two duplicate copies, etc.

Memory controller 406 may duplicate command packet 430 in any suitable manner. For example, memory controller 406 can make a copy of packet 430 and store both the original access request and the copy in volatile memory 422. In some embodiments, memory controller 406 may further use volatile memory 422 to organize command packet 440, which can include the original command access request and address from command packet 430 as well as duplicate copies of the metadata and data from command packet 430. In other embodiments, the command access request and address may also be duplicated to form command packet 440. In still further embodiments, only the data may be duplicated, leaving only one copy of the command access request, address, and metadata.

Figure 5:
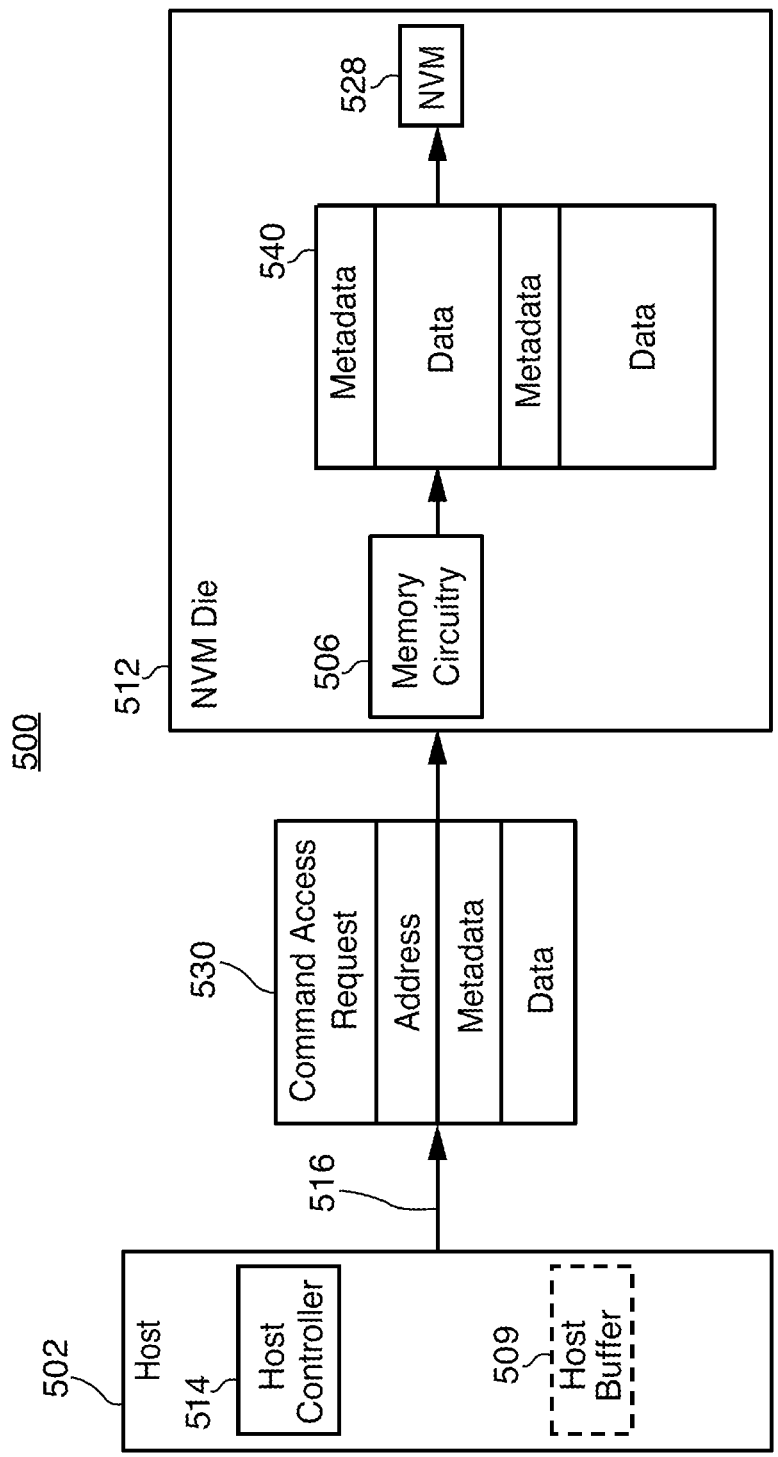
FIG. 5 is yet another illustrative diagram of a system with a command packet being transferred from a host to an NVM die in accordance with various embodiments.

FIG. 5 is an illustrative diagram of a system 500 including command packet 530 being transferred from a host 502 to an NVM die 512, in accordance with some embodiments. System 500 may represent a raw NVM arrangement, in which host controller 514 performs memory management functions for NVM die 112. NVM die 112 can include memory circuitry 506, command packet 540, and NVM 528. Memory circuitry 506 may be any suitable circuitry capable of receiving a command packet, determining and carrying out the indicated command access request at the indicated address. For example, memory circuitry may receive a write access request for a given logical address, determine the appropriate physical address corresponding to the logical address, and program the data and metadata to the determined physical address.

In some embodiments, host controller 514 can duplicate command packets organized in host buffer 509 for transmittal to NVM die 512 over communications channel 516. In such embodiments, system 500 may be very similar to system 300 disclosed above. That is, host controller 514 can create any suitable number of copies of a given command packet and transfer the command packets (e.g., command packet 530) to NVM die 512 consecutively or non-consecutively. Memory circuitry 506 may receive the command packets and program the data and metadata in command packet 540 to the appropriate locations in NVM 528. For example, host 502 may transfer two copies of command packet 530 to NVM die 512, which can be received at NVM die 512 and programmed by memory circuitry 506 to NVM 528. Identical command packets may be stored temporarily in a volatile memory of NVM die 512 until all of the data and metadata can be combined into a single command packet 540 to be programmed to NVM 528 at once.

In other embodiments, NVM die 512 can receive only a single command packet 530 from host 502. If the memory circuitry 506 determines that the size of command packet 530 is less than the capacity of the characteristic portion of NVM 528, one or more duplicate copies of command packet 530 can be created and combined into command packet 540 and programmed to NVM 528 at once. As described above, the data and metadata programmed to NVM 528 may be arranged in any suitable manner. For example, each characteristic portion can include only a single copy of the metadata and two (or more) copies of the data. Alternatively, each characteristic portion can include two or more copies of both the data and the metadata.

As an alternative to, or in addition to, duplicating data when the host buffer capacity is smaller than the size of the characteristic portion, randomized (or whitened) data may be programmed to the unprogrammed portion of a characteristic portion of NVM. In these embodiments, whitened data may be generated in any suitable component within a memory system. The whitened data may be generated in any suitable manner including using, for example, one or more random number generators.

As one example, with reference to FIG. 1, when a write request is received, data to be written can be organized into a command packet (e.g., command packet 230) in host buffer 109. Next, a predetermined amount of whitened data can be generated in host controller 114 of host 102 and transferred to NVM package 104. The amount of whitened data may depend, for example, on the size of host buffer 109, which may be used to temporarily store the whitened data, the amount of data in the command packet, and/or the size of the characteristic portion in the NVM of NVM package 104. For example, if the size of the characteristic portion of the NVM is 16K and the host buffer has a capacity of 8K, host controller 114 can generate a first 8K command packet including the data to be written to the NVM as well as 8K of whitened data, which may be generated by host controller 114 and transferred to NVM package 104 (e.g., as part of a second 8K command packet). One skilled in the art will appreciate that any suitable amount of whitened data may be generated to program the balance of a characteristic portion not programmed with data associated with the write request.

As another example, whitened data may be generated by a memory controller of the system (e.g., memory controller 106 of FIG. 1). Whitened data may be generated, for example, any time that memory controller 106 receives a command packet (e.g., command packet 230 of FIG. 2) that includes less data than the size of the characteristic portion of NVMs128a-n. For example, if memory controller 106 receives a command packet including 8K of data and the capacity of the characteristic portion is 16K, memory controller 106 may generate 8K of whitened data, combine it with the 8K of data received from host 102, and program the resulting 16K of data and whitened data to the NVM.

In some embodiments, whitened data may only be generated when the unprogrammed portion of the NVM exceeds a certain threshold value. For example, if utilization of the characteristic portion is between 98-100%, whitened data may not be generated to fill the unprogrammed portion. However, if utilization of the characteristic portion is <98%, whitened data may be generated to fill the unprogrammed capacity of the characteristic portion.

Figure 6:
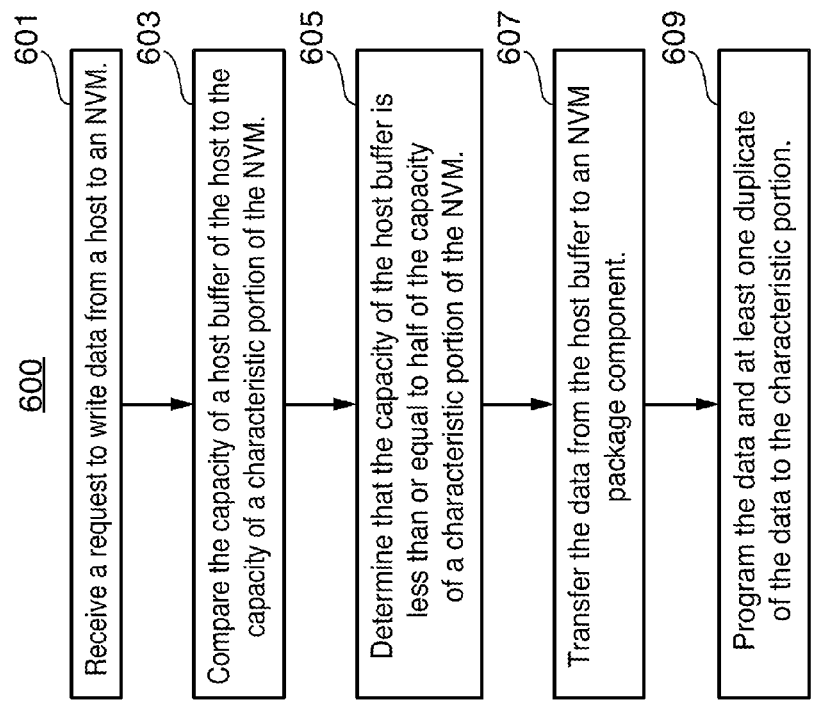
FIG. 6 is another flowchart of an illustrative process writing to high-capacity memory in accordance with various embodiments.

FIG. 6 is a flowchart of an illustrative process 600 for writing to high-capacity memory, in accordance with some embodiments. Process 600 can begin at step 601, in which a host device (e.g., host 102 of FIG. 1) can receive a request to write data to an NVM (e.g., NVMs 128a-n of FIG. 1). If the host device is a media player, the data may represent a digital media file such as, for example, a song or a video.

At step 603, the capacity of a host buffer (e.g., host buffer 109 of FIG. 1) of the host can be compared to the capacity of a characteristic portion of the NVM. In embodiments in which the NVM is a NAND flash memory, the characteristic portion may represent a single page. The comparison between the size of the characteristic portion and the capacity of the host buffer may be achieved in any suitable manner. As one example, the NVM package housing the NVM (e.g., NVM package 104) can transfer information about the NVM to the host (e.g., using memory controller 106 and host interface 110) upon startup and/or initialization. The information transferred from the NVM package to the host can include specifications of the NVM including the size of the characteristic portion. As another example, the host may communicate with the NVM package before executing each write request. During this communication the host may query the NVM package for the capacity of the characteristic portion of the NVM contained that NVM package.

One skilled in the art may appreciate that step 603 may not be required for each write request received at the host. For example, in embodiments in which the specifications of the NVM are transferred to the host once (e.g., upon startup), the comparison between the capacity of the host buffer and the capacity of the characteristic portion may only be required once (e.g., before or during the first write request received by the host after startup).

At step 605, it can be determined whether the capacity of the host buffer is less than or equal to half of the capacity of the characteristic portion of the NVM. If the capacity of the host buffer is less than or equal to half of the capacity of the characteristic portion of the NVM, at least two copies of data organized in the host buffer can be stored within the same characteristic portion. Similarly, if the capacity of the host buffer is less than or equal to half of the capacity of the characteristic portion of the NVM, at least three copies of data organized in the host buffer can be stored within the same characteristic portion, and so on. One skilled in the art may appreciate that depending on the relative sizes of the host buffer and the characteristic portion, any suitable number of copies of data organized in the host buffer can be stored in a given characteristic portion.

At step 607, the data can be transferred form the host buffer to an NVM package component. In some embodiments, the data transferred from the host buffer to the characteristic portion may represent only a fraction of the total data associated with the write request. For example, if the host receives a request to write a 4 MB file from the host to the NVM and the host buffer has a capacity of 8K, only 8K of the file will be transferred from the host buffer to the NVM at once. As described above, the data may be organized into a command packet (e.g., command packet 230) within the host buffer for transfer to the NVM.

The NVM package component may be any suitable component within an NVM package (e.g., NVM package 104) housing the NVM. For example, the data can be transferred from the host buffer to a volatile memory of the NVM package (e.g., volatile memory 122 of FIG. 1). The data can remain in the NVM package component until it is programmed to a portion of the NVM.

At step 609, the data and at least one duplicate of the data can be programmed to a characteristic portion of the NVM. In some embodiments, as described with respect to FIG. 3 above, for example, host controller 314 can generate a duplicate command packet 330b of a command packet 330a, which includes the data associated with the write request. Both command packets 330a and 330b can be transferred to a component of NVM package 304 (e.g., volatile memory 322), combined into command 340 and programmed to a characteristic portion of NVM 328. According to some embodiments, host controller 314 may not create a distinct duplicate of command packet 330a, rather host controller 314 may simply repeat the transfer of command packet 330a.

In further embodiments, such as described with respect to FIG. 4 above, host controller 414 may transfer the data a single time to a component of NVM package 304 (e.g., volatile memory 422). In such embodiments, a component of NVM package 404 (e.g., memory controller 406) can duplicate the data received from host 402, combine the original data and the duplicate into a single command packet 440, and program the data and the duplicate to a characteristic portion of NVM 428.

As described above, any suitable number of duplicates may be generated and programmed to the characteristic portion along with the original data in this way, depending on the relative capacities of the host buffer and the characteristic portion.

Figure 7:
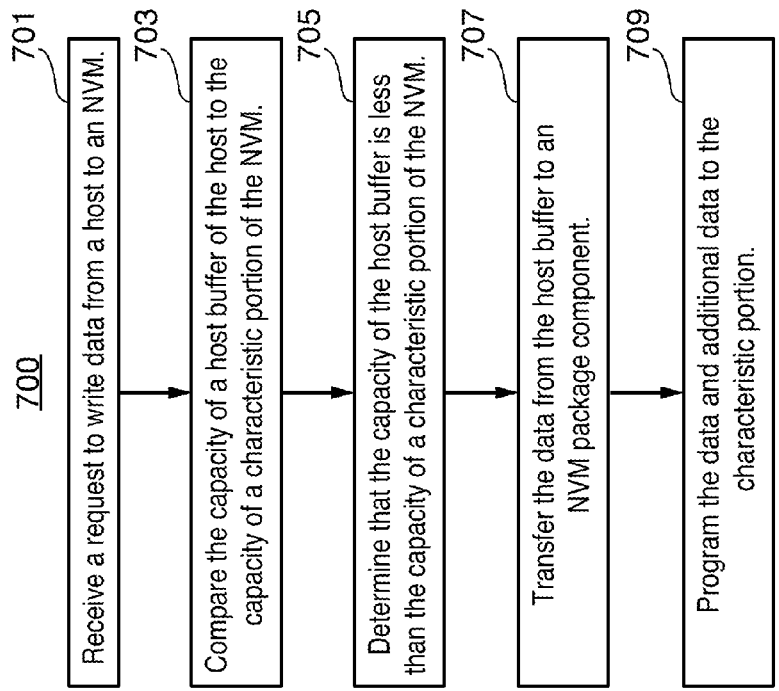
FIG. 7 is another flowchart of an illustrative process writing to high-capacity memory in accordance with various embodiments.

FIG. 7 is a flowchart of an illustrative process 700 for writing to high-capacity memory, in accordance with some embodiments. Steps 701-707 of process 700 can proceed generally as described above with respect to steps 601-607 of process 600, respectively, with the distinction that the capacity of the host buffer is determined to be less than the capacity of a characteristic portion of the NVM at step 705. Thus, the capacity of the host buffer may be, but need not be less than half of the capacity of the characteristic portion.

At step 709, the data and additional data can be programmed to the characteristic portion. The additional data may be any suitable data including, but not limited to, additional user data received from the host (e.g., a copy of the data received from the host or additional data associated with the write request) or whitened data. As described above, whitened data may be generated by the host and transferred to the NVM or generated within an NVM package component (e.g., memory controller 106 of FIG. 1). Before programming the data and the additional data to the NVM, the data and additional data can be combined into a single command packet (e.g., command packet 540). The data in the command packet can then be programmed at one time to a characteristic portion of the NVM.

It is to be understood that the steps shown in processes 600 and 700 are merely illustrative and that existing steps may be modified or omitted, additional steps may be added, and the order of certain steps may be altered.

While there have been described systems and methods for providing early hinting to charge pumps of a nonvolatile memory system, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A method for writing to high-capacity memory, the method comprising:
 receiving a request to write data from a host to a characteristic portion of a nonvolatile memory ("NVM"), wherein the characteristic portion is a smallest portion of the NVM that can be programmed;
 determining that a capacity of a host buffer is less than or equal to half of a capacity of the characteristic portion;
 transferring the data from the host buffer to an NVM package component; and
 programming the data and at least one duplicate of the data to the characteristic portion.

2. The method of claim 1, further comprising generating the at least one duplicate of the data at the host and transferring the at least one duplicate of the data from the host buffer to the NVM package component.

3. The method of claim 1, further comprising generating the at least one duplicate of the data at the NVM package component.

4. The method of claim 1, further comprising transferring the data from the host buffer to an NVM package component a second time to generate a duplicate of the data.

5. The method of claim 1, further comprising combining the data and at least one duplicate of the data before the programming.

6. The method of claim 1, wherein the number of duplicates of the data depends on the relative capacities of the host buffer and the characteristic portion.

7. The method of claim 1, further comprising comparing the capacity of the host buffer of the host to the capacity of the characteristic portion of the NVM.

8. The method of claim 7, wherein the comparing is executed once upon initialization of the NVM.

9. The method of claim 7, wherein the comparing is executed each time upon receiving a request to write data from the host to a characteristic portion of the NVM.

10. A method for writing to high-capacity memory, the method comprising:
 receiving a request to write data from a host to a characteristic portion of a nonvolatile memory ("NVM"), wherein the characteristic portion is a smallest portion of the NVM that can be programmed;
 determining that a capacity of a host buffer is less a capacity of the characteristic portion;
 transferring the data from the host buffer to an NVM package component; and
 programming the data and additional data to the characteristic portion.

11. The method of claim 10, further comprising combining the data and additional data before the programming.

12. The method of claim 10, wherein the amount of additional data programmed to the NVM is equal to or less than the capacity of the characteristic portion minus the capacity of the host buffer.

13. The method of claim 10, wherein the additional data comprises whitened data.

14. The method of claim 13, further comprising generating whitened data at the host and transferring the whitened data to the NVM package component.

15. The method of claim 13, further comprising generating whitened data at the NVM package component.

16. A system for writing to high-capacity memory, the system comprising:
 non-volatile memory ("NVM") comprising a plurality of characteristic portions, wherein each characteristic portion is a smallest portion of the NVM that can be programmed, comprising a first capacity;

a host device communicatively coupled to the non-volatile memory, the host device comprising a host controller and a host buffer, wherein the host buffer has a second capacity, and the first capacity is larger than the second capacity; and an NVM package component configured to:
  receive data transferred from the host buffer during a write request initiated by the host controller;
  combine the data with additional data; and
  program the data and the additional data to a characteristic portion of the NVM. package component comprises a memory controller.

17. The system of claim 16, wherein the NVM package component comprises a memory controller.

18. The system of claim 16, wherein the first capacity is more than three times the second capacity, and wherein the additional data comprises an item selected from the group consisting of:
  two duplicate copies of the data;
  one duplicate copy of the data and whitened data; and
  whitened data.

19. The system of claim 16, wherein the first capacity is more than twice the second capacity.

20. The system of claim 19, wherein the additional data comprises a duplicate copy of the data.

21. The system of claim 19, wherein the additional data comprises whitened data.

* * * * *